United States Patent [19]

Hochbein

[11] Patent Number: 5,178,260
[45] Date of Patent: Jan. 12, 1993

[54] PALLET FOR DRYING CERAMIC CARDS
[75] Inventor: David E. Hochbein, Sarver, Pa.
[73] Assignee: Aluminum Company of America, Pittsburgh, Pa.
[21] Appl. No.: 660,554
[22] Filed: Feb. 26, 1991
[51] Int. Cl.⁵ .............................................. B65G 17/00
[52] U.S. Cl. ........................ 198/803.01; 198/803.15; 198/803.2
[58] Field of Search ............... 198/803.01, 803.13, 198/803.14, 803.15, 803.2

[56] References Cited

U.S. PATENT DOCUMENTS

| | | | |
|---|---|---|---|
| 695,628 | 3/1902 | Schlieper . | |
| 1,801,574 | 4/1931 | Schuldt . | |
| 3,578,144 | 5/1971 | Punzak | 198/41 |
| 3,587,829 | 6/1971 | Sorensen | 198/131 |
| 3,610,407 | 10/1971 | Prodzenski | 198/803.01 |
| 3,805,942 | 4/1974 | Auernhammer | 198/803.01 X |
| 3,931,882 | 1/1976 | Ossbahr | 198/165 |
| 4,033,450 | 7/1977 | Paddock et al. | 198/803.01 |
| 4,167,999 | 9/1979 | Haggerty | 198/851 |
| 4,497,677 | 2/1985 | Sanada et al. | 156/89 |
| 4,516,675 | 5/1985 | Koskovich | 198/654 |
| 4,539,058 | 9/1985 | Burgess et al. | 156/250 |
| 4,790,427 | 12/1988 | Dixon | 198/803.01 |
| 4,896,763 | 1/1990 | Hordyk et al. | 198/803.2 |
| 4,954,069 | 9/1990 | Friedwald | 198/803.2 X |

Primary Examiner—Joseph E. Valenza
Assistant Examiner—Tuan N. Nguyen
Attorney, Agent, or Firm—Peoples, Hale & Coleman

[57] ABSTRACT

A pallet for use in drying ceramic cards that have product sites thereon, including a body having a plurality of openings therein defined by a series of highways, whereby the openings have the general shape of the product sites; at least one skirt extending perpendicularly from the body contains an open slot or recess located adjacent the front of the body; at least one skirt extending perpendicularly from the body contains an open, rearward facing, elongated slot adjacent the rear end of the body; a series of clusters of holes are provided along the perimeter of the body.

1 Claim, 3 Drawing Sheets

PALLET FOR DRYING CERAMIC CARDS

BACKGROUND OF THE INVENTION

1. Technical Field

This invention relates to the manufacture of multilayer co-fired ceramic substrates for packaging integrated circuit chips, and more particularly to a unique pallet for drying green ceramic cards used in making such substrates.

2. Description of the Prior Art

Techniques for manufacturing multilayer ceramic cards that are used for the above substrates in the electronic industry are well known in the art. U.S. Pat. No. 4,539,058 to Burgess et al., and U.S. Pat. No. 4,497,677 to Sanada et al. are two references that discuss such techniques.

In general, multilayer ceramic cards are made from green sheets of ceramic material. (The term "green" refers to unfired ceramic bodies.) Each green sheet contains a plurality of spaced apart product sites. The sheets are made by forming a slip from a mixture of ceramic powder, organic binder, and solvent. The slip can be cast onto a suitable sheet material and dried. The green sheets, after blanking, are then stacked, processed and laminated. The product sites are cut from or punched out of the laminated stack and sintered.

In accordance with prior art methods, the green sheets are transferred through dryers by continuous type belts. Such techniques require manual loading and unloading. Since the green sheets are fragile and easily broken and torn, manual handling results in high production losses and costs. In addition, contamination is transferred from the belt to the green sheet. Attempts at automatic loading and unloading of these belts have produced smears and product contamination due to the sliding of the part on the moving belt during part removal.

SUMMARY OF THE INVENTION

To eliminate this problem, the present invention employs a pallet that is supported by transverse rods, the pallet supporting the part fully. Movement of the pallet and card through the dryer is indexed so that only during the stopped portion of the cycle is the card either placed onto or removed from the pallet. This totally eliminates any sliding action at the part/pallet interface.

The stopped position of the pallet either at the entry or exit end of the furnace (dryer) can be determined by electrical sensors. Such sensors provide positional accuracy and allows ease of part placement and removal.

It is therefore an object of this invention to provide a pallet for use in loading and unloading green ceramic sheets.

It is another object of the present invention to provide an easily assembled and disassembled pallet.

It is still another object of the present invention to provide a pallet which will facilitate a mechanism for chordal action when directed around sprockets.

It is still another object of the present invention to provide an easily made and inexpensive pallet adaptable to varying configurations for various product types.

These and other objectives are met by a unique pallet for receiving and unloading green ceramic cards. The pallet is mounted on a front rod and a rear rod by means of a rearward facing elongated slot provided at the rear end of the pallet, and a recess at the front end of the pallet extending in a direction generally perpendicular to the plane of the pallet. The elongated rear slot and the front recess allow for quick engagement and disengagement of the pallet from the rods. In addition, the elongated rear slot and the front recess facilitate the movement of the pallet around sprockets which are used to return empty pallets to a location for receiving new green ceramic cards.

DETAILED DESCRIPTION OF THE PREFERRED EMBODIMENTS

Figure 1:
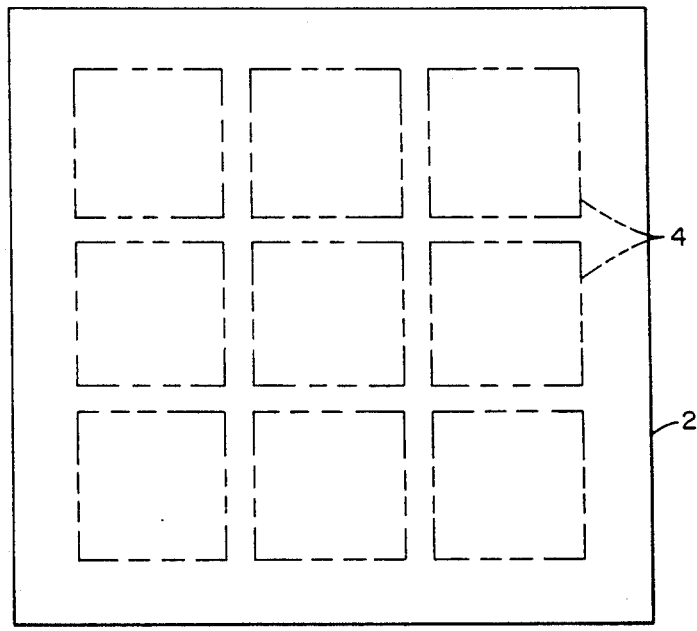
FIG. 1 illustrates a ceramic green card which is carried by a pallet designed in accordance with a preferred embodiment of the present invention.

In forming multilayer ceramic cards in accordance with the present invention, conventional methods, as described above, can be used to form a green sheet. Once the slip is cast, it is allowed to partially dry. The slip is then cut into ceramic cards 2, one of which is shown in plan view in FIG. 1. Each ceramic card 2 includes a plurality of product sites 4, which are ultimately punched therefrom, laminated, stacked and cured to form the final product. The product sites 4 can have various configurations. FIG. 1 illustrates a ceramic card 2 having a configuration of nine square product sites 4.

Figure 2:
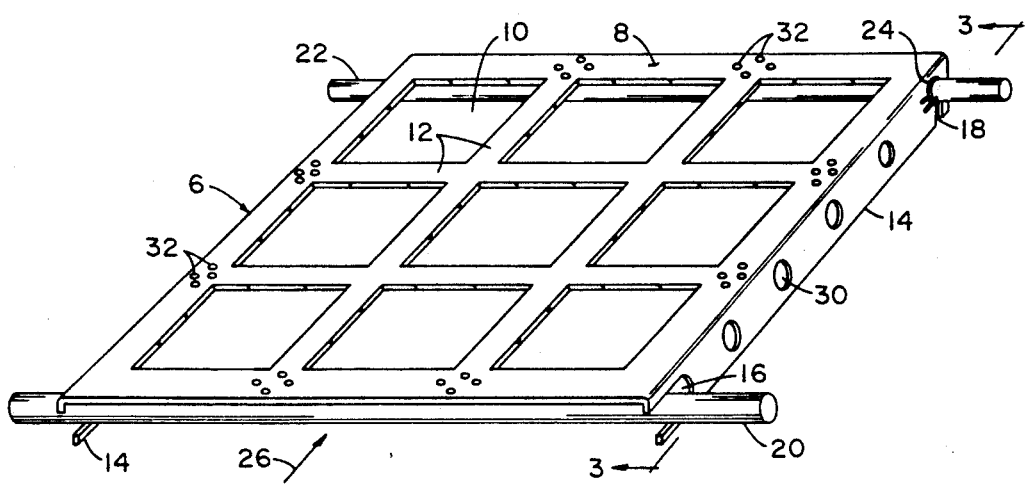
FIG. 2 is a perspective view of a single pallet in accordance with a preferred embodiment of the present invention.

After the partially dried slip is cut into cards 2, the cards are screen printed with an electrically conductive paste. Referring now to FIG. 2, the cards are then transferred to pallets 6 (of the present invention) and carried through a suitable furnace (not shown) for drying. FIG. 2 illustrates a preferred embodiment of pallet 6, which comprises a planar rigid main body portion 8 having a plurality of openings 10 therein, which are defined by a series of connecting highways 12. The openings 10 can be of various configurations, and are identical to the configuration of the product sites on the ceramic cards which are ultimately dried thereon The pallet 6 illustrated in FIG. 2 includes nine square openings 10, though not limited thereto, which are similar to and coincide with the nine product sites 4 on the ceramic card 2 illustrated in FIG. 1. When the ceramic card 2 is transferred to the pallet 6, the nine product sites 4 are aligned with and lie over the nine openings 10, thereby preventing the product sites 4 on the ceramic card 2 from contacting the surfaces of body 8 of the pallet 6. This reduces the possibility of contaminating the product sites 4. Since the design of the end products vary and thus the shape of the product sites 4 vary, in accordance with other embodiments of the present invention, the pallet 6 can have different interior configurations corresponding to other end product designs.

In a preferred embodiment of the invention, pallet 6 further includes two side wall portions or skirts 14 that extend generally perpendicularly from opposite sides of the main body 8. As can best be seen in FIG. 3, each skirt 14 is provided with an open, rearward facing, elongated slot 16 adjacent to the rear of the pallet, which extends forward from the rear end of said skirt in a direction generally parallel to the plane of the main body 8. Each skirt 14 further includes an open recess 18 near the front of the pallet, which extends from the edge of and into the skirt in a direction generally perpendicular to the plane of main body 8.

In an alternative embodiment of the present invention (not illustrated), pallet 6 can include four skirts, with two extending generally perpendicular from opposite sides of the front of main body 8, and two extending generally perpendicularly from opposite sides of the rear of main body 8. In accordance with this embodiment, each of the forward skirts incudes an open recess 18, and each of the rearward skirts includes an open elongated slot 16.

Figure 4:
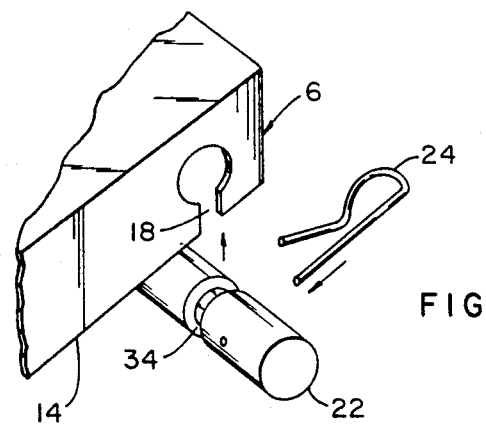
FIG. 4 is a perspective view of the front recess of the pallet of the present invention illustrating its engagement with the front rod.
Figure 6:
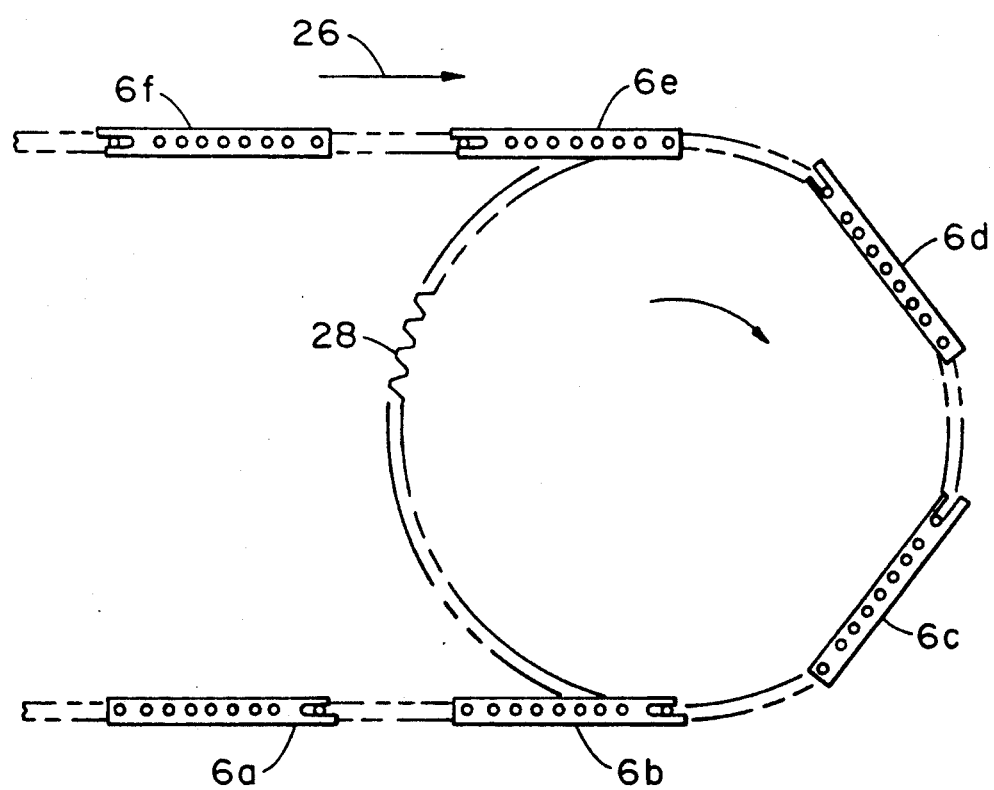
FIG. 6 is a side view of a portion of an endless conveyor carrying the pallets of the present invention and illustrates chordal action when the pallets travel around a sprocket.

As illustrated further in FIG. 2, and in accordance with the present invention, the pallet is attached to and supported by two rods 20 and 22 suitably connected to a conveying means (FIG. 6). Rod 22 is considered a front rod and rod 20 a rear rod. The rear rod 20 is first inserted into the elongated slot 16. As shown in FIG. 4, the front rod 22 includes an indentation 34. The recess 18 is then placed over the indentation 34 on front rod 22, and a clip 24 is inserted through the rod on each side of the pallet to laterally retain the pallet. This unique attachment mechanism utilizing the recesses and slots enable an operator to quickly change the pallet when a ceramic card having a different configuration is to be made.

Figure 5:
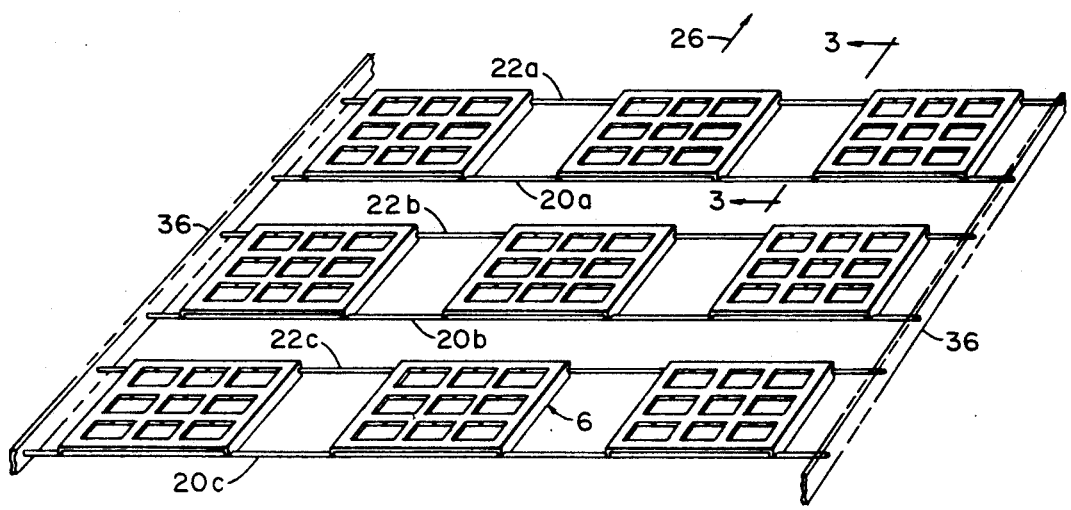
FIG. 5 is a perspective view of an array of pallets in accordance with a preferred embodiment of the present invention.

In accordance with a preferred embodiment of the invention, an array of pallets is used to form an automatic loading and unloading operation for transferring ceramic cards through a furnace. Such an array is illustrated in FIG. 5. In particular, a series of pallets 6 are connected by and supported on a series of front and rear rods 22 and 20 suitably connected to two parallel roller chains 36 (only schematically depicted in FIGS. 5 and 6). Roller chains are power driven chains comprised of links similar to those found in bicycle chains. The ends of the rods are an integral part of the links such that the chains carry the rods and the pallets through the drying process. As illustrated by arrow 26, the rods carry the pallets in a direction perpendicular to the rod axes. Each pallet 6 is secured to the rods in the manner described above.

When the ceramic card 2 is formed, it is placed on a pallet 6 and transferred through a furnace. After leaving the furnace, the card is preferably vacuum lifted from the pallet 6 only when the pallet is stopped on the indexing cycle, and taken to other stations for further processing. As illustrated in FIG. 6, empty pallets are returned to a location for receiving new green ceramic cards by use of roller chains 36 and sprockets 28. Each pallet 6 is carried by the chains and rods through the process and returned to the beginning of the process where a new ceramic card 2 is transferred to a pallet. At least two sprockets are included in the loop to change the direction in which the pallets travel.

Figure 3:
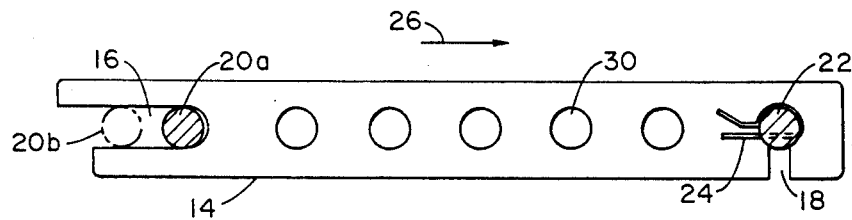
FIG. 3 is a side view of a single pallet in accordance with a preferred embodiment of the present invention.

The elongated rearward slot 16 provides means to reduce the distance between the front rod 22 and the rear rod 20 automatically to facilitate the circular movement around sprocket 28. As the pallet 6 travels around the sprocket, the rods enter a sprocket mode, i.e. the pallet forms chord on the circle of the sprocket. The distance, therefore, between the rear rod 20 and the front rod 22 decreases on the sprocket. The rods securing pallets 6c and 6d in FIG. 6 are shown in the sprocket mode. In addition, rear rod 20a in FIG. 3 is shown in its sprocket mode position. When the pallet 6 leaves the sprocket 28, the distance between the two rods increases and the rods return to a straight line mode in which the distance between them is not affected by circular travel. The rods securing pallets 6a, 6b, 6e and 6f in FIG. 6 are shown in straight line modes. Similarly, the rear rod 20b in FIG. 3 is shown in the straight line mode.

As can be seen in FIGS. 2 and 3, the wall portions or skirts 14 may also include perforations 30 which lighten the pallet 6, and reduce its overall thermal mass. This is desirable for two reasons. First, pallet 6 is more easily translated, removed and inserted if it is lighter. Second, when the pallets enter the furnace they are at room temperature. As a result of the temperature differential between the pallets and the furnace, the pallets tend to cool the furnace. Since the perforations reduce the thermal mass, there is less of a tendency to remove heat from the furnace, and greater efficiency of energy is achieved. Additionally, as the pallets/parts exit the furnace, they can be cooled more easily due to the lower thermal mass of each pallet. Referring to FIG. 2, the body of pallet 6 is shown provided with a series of clusters of holes 32. Such holes 32 are preferably on the order of 1/16th inch in diameter, and are located along the perimeter of the body 8. The purpose of such holes 32 is to prevent the vacuum that lifts the card from the pallet from imposing a force upon the pallet.

While the invention has been described in terms of preferred embodiments, the claims appended hereto are intended to encompass all embodiments which fall within the spirit of the invention.

What is claimed is:

1. A device for use in drying ceramic cards that have product sites thereon, comprising:

a pallet having a body with a front portion and a rear portion, said body having a plurality of openings therein defined by a series of highways, whereby said openings have the general shape of said product sites; said pallet further having at least one skirt extending perpendicularly from said body which defines a recess, whereby such recess is located adjacent to said front portion of said body; said pallet further having at least one skirt extending perpendicularly from said body which defines an elongated slot, whereby said elongated slot is adjacent to said rear portion of said body;

a rear rod which is inserted into said elongated slot;

a front rod having indentation which is placed in said recess and placing at least one clip over said front rod adjacent to said indentation to laterally retain said pallet;

said front rod and said rear rod being suitable connected to conveying means.

* * * * *